(12) United States Patent
Menkhoff

(10) Patent No.: US 8,271,568 B2
(45) Date of Patent: Sep. 18, 2012

(54) DIGITAL FILTER

(75) Inventor: Andreas Menkhoff, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 1055 days.

(21) Appl. No.: 12/201,465

(22) Filed: Aug. 29, 2008

(65) Prior Publication Data

US 2010/0057821 A1 Mar. 4, 2010

(51) Int. Cl.
*G06F 17/17* (2006.01)
(52) U.S. Cl. ......................................... 708/313
(58) Field of Classification Search .................. None
See application file for complete search history.

(56) References Cited

U.S. PATENT DOCUMENTS

| | | | |
|---|---|---|---|
| 5,357,447 A | 10/1994 | Ichiyoshi | |
| 6,446,103 B2 | 9/2002 | Schollhorn | |
| 6,954,114 B2 | 10/2005 | Schoner | |
| 7,466,247 B1 * | 12/2008 | Gorbics | 341/61 |
| 2005/0278403 A1 | 12/2005 | Miller | |
| 2006/0250287 A1 | 11/2006 | Menkhoff et al. | |
| 2008/0147761 A1 * | 6/2008 | Melanson | 708/313 |
| 2010/0057821 A1 * | 3/2010 | Menkhoff | 708/300 |
| 2010/0058103 A1 * | 3/2010 | Menkhoff | 713/502 |

FOREIGN PATENT DOCUMENTS

DE 198 29 289 C2 1/2000
DE 10 2005 018 858 A1 11/2006

OTHER PUBLICATIONS

Meyr, Heinrich, et al., "Digital Communication Receivers", Wiley Series in Telecommunications and Signal Processing, Chapter 9, pp. 505-532, 1998.

* cited by examiner

*Primary Examiner* — David H Malzahn
(74) *Attorney, Agent, or Firm* — Banner & Witcoff, Ltd.

(57) ABSTRACT

Methods and apparatuses in which a first stage of a digital filter receives input data to be filtered, the first stage of a digital filter operating at a first clock; a second stage of the digital filter outputs filtered output data, the second stage of the digital filter operating on a second clock, wherein a ratio of a frequency of the first clock and a frequency of the second clock is a fractional number, and a frequency of the second clock is higher than a frequency of the first clock; the first stage receives an indication of a ratio of the first clock and the second clock; and the first stage receives an indication of a time offset between (1) a clock pulse of the second clock, which occurs between a first clock pulse and a second clock pulse of the first clock, and (2) the first clock pulse of the first clock.

25 Claims, 11 Drawing Sheets

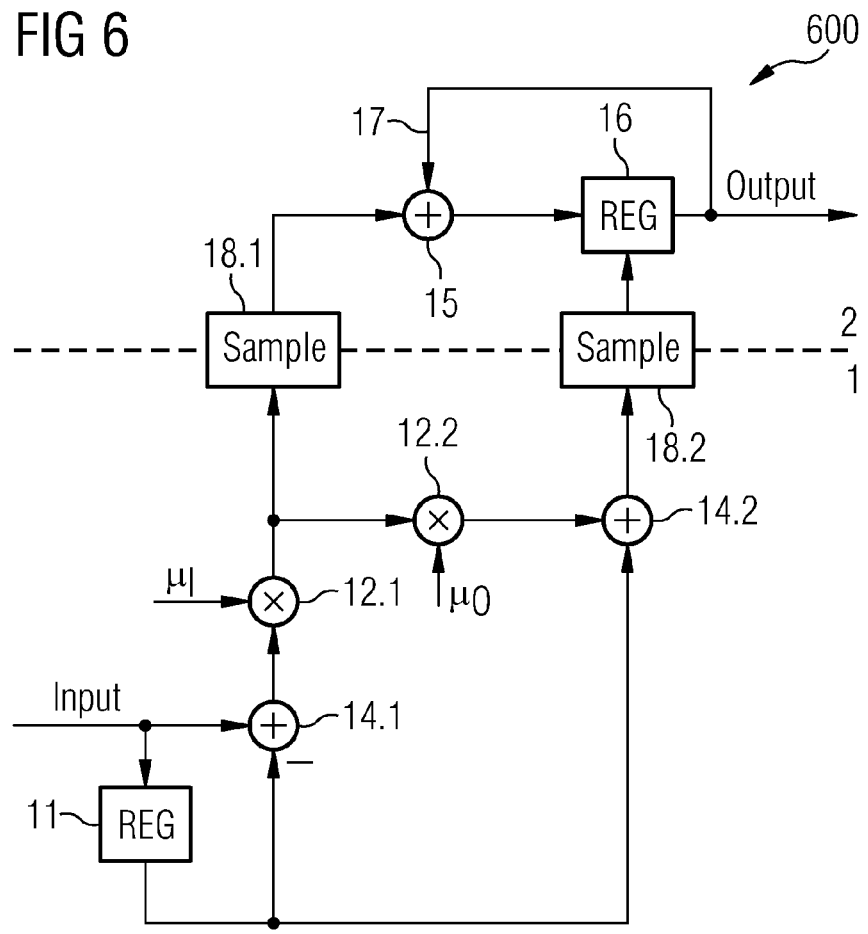
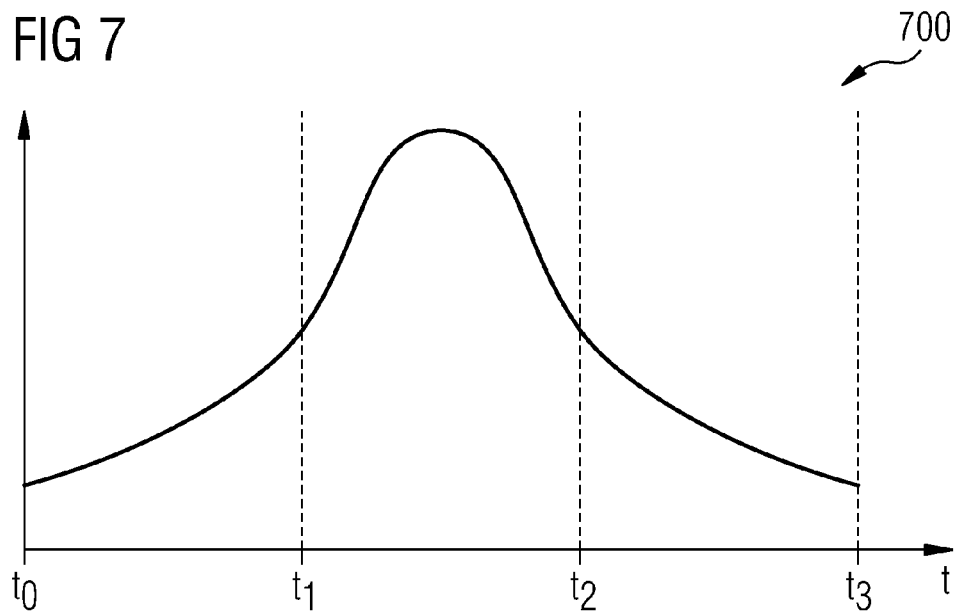

DIGITAL FILTER

BACKGROUND OF THE INVENTION

Digital circuits may comprise digital filters to convert input data of a first frequency clock to output data of a second frequency clock. For the case of an interpolation filter the input data has a lower frequency clock than the output data, while in a decimation filter the input data has a higher frequency clock than its output data. Digital filters thus may comprise multiple stages operating at different frequency clocks.

SUMMARY

Various aspects are described herein. For example, some aspects are directed to methods and apparatuses in which a first stage of a digital filter receives input data to be filtered, the first stage of a digital filter operating at a first clock; a second stage of the digital filter outputs filtered output data, the second stage of the digital filter operating on a second clock, wherein a ratio of a frequency of the first clock and a frequency of the second clock is a fractional number, and a frequency of the second clock is higher than a frequency of the first clock; the first stage receives an indication of a ratio of the first clock and the second clock; and the first stage receives an indication of a time offset between (1) a clock pulse of the second clock, which occurs between a first clock pulse and a second clock pulse of the first clock, and (2) the first clock pulse of the first clock.

These and other aspects will be described herein in the following Detailed Description of Illustrative Embodiments.

BRIEF DESCRIPTION OF THE SEVERAL VIEWS OF THE DRAWINGS

Various aspects as described herein are made more evident by way of example in the following detailed description of illustrative embodiments when read in conjunction with the attached figures.

FIG. 6 schematically illustrates a digital filter 600 as an exemplary embodiment.

FIG. 7 shows an illustrative pulse response 700.

DETAILED DESCRIPTION OF ILLUSTRATIVE EMBODIMENTS

Figure 1:
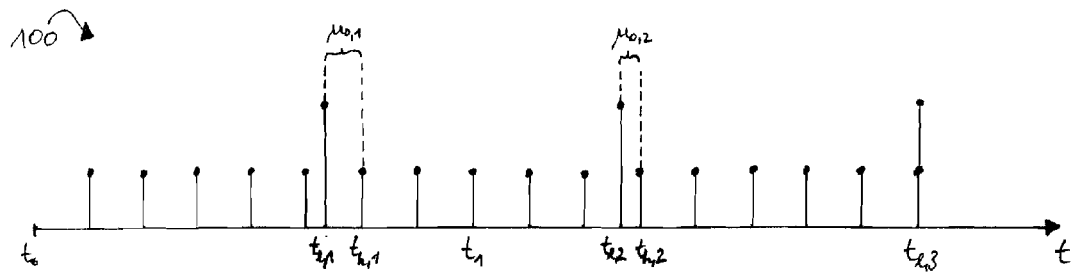
FIG. 1 shows an illustrative timing diagram 100.

In the following one or more aspects and embodiments are described with reference to the drawings, wherein like reference numerals are generally utilized to refer to like elements throughout. In the following description, for purposes of explanation, numerous specific details are set forth in order to provide a thorough understanding. It may be evident, however, to one skilled in the art that one or more aspects as described herein may be practiced with a lesser degree of these specific details. In other instances, known structures and devices are shown in block diagram form in order to facilitate describing the one or more aspects. The following description is not to be taken in a limiting sense, and rather should be taken in an illustrative sense.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the disclosure or the claims, such terms are intended to be inclusive in the same manner as the term "comprise". The terms "coupled" and "connected", along with derivatives may be used. It should be understood that these terms may be used to indicate that two elements cooperate or interact with each other regardless of whether they are in direct or indirect physical, electrical, or other type of communicative contact, or they are not in direct contact with each other. Also, the term "exemplary" or "illustrative" refers to merely an example, rather than necessarily the best or optimal.

FIG. 1 shows an illustrative timing diagram 100 based on a low frequency clock and a high frequency clock, both starting at a time $t_0$. The terms "low" and "high" frequency as used herein are relative terms and do not imply any absolute frequency ranges. The timing diagram 100 shows three clock pulses of the low frequency clock (cf. high peaks at times $t_{1,1}$, $t_{1,2}$ and $t_{1,3}$) and sixteen clock pulses of the high frequency clock (cf. low peaks such as at time $t_1$). Since frequency ratios of the high frequency clock and the low frequency clock correspond to a fractional number (e.g. 16/3 or 3/16), the clock pulses of the high frequency clock do not coincide with the clock pulses of the low frequency clock at the times $t_{1,1}$ and $t_{1,2}$. The first time of coincidence between the two frequency clocks is given at the time $t_{1,3}$.

During a first time interval between the times $t_0$ and $t_{1,1}$ five clock pulses of the high frequency clock occur. Similarly, five clock pulses of the high frequency clock occur during a second time interval between the times $t_{1,1}$ and $t_{1,2}$. Here, the first clock pulse of the high frequency clock in the second time interval (cf. time $t_{h,1}$) does not coincide with the first clock pulse of the low frequency clock at the time $t_{1,1}$. Instead, the clock pulse of the high frequency clock at the time $t_{h,1}$ is arranged 2/3 (in units of the high frequency clock) to the right of the time $t_{1,1}$. A parameter $\mu_{O,1}$ denotes a corresponding value of the time offset.

A third time interval is given between the times $t_{1,2}$ and $t_{1,3}$. Six clock pulses of the high frequency clock occur in this third time interval, wherein the clock pulses of the low frequency clock and the high frequency clock coincide at the time $t_{1,3}$. The first clock pulse of the high frequency clock in the third time interval (cf. time $t_{h,2}$) is arranged 1/3 (in units of the high frequency clock) to the right of the time $t_{1,2}$. A corresponding value of the time offset is denoted by a parameter $\mu_{O,2}$.

It is understood that further time intervals may succeed the described three time intervals. Such further time intervals may be obtained by simply repeating the first three time intervals. For example, a fourth time interval would then correspond to the first time interval, a fifth time interval would correspond to the second time interval and a sixth time interval would correspond to the third time interval.

Figure 2:
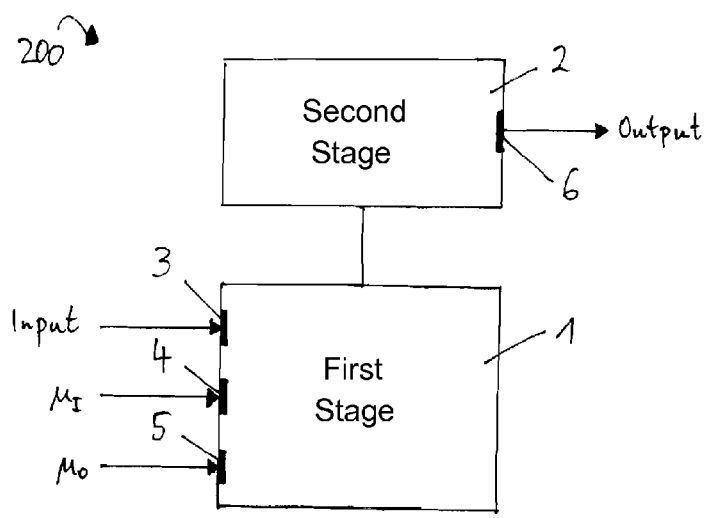
FIG. 2 schematically illustrates a digital filter 200 as an exemplary embodiment.

FIG. 2 schematically illustrates a digital filter 200 as an exemplary embodiment. For example, the digital filter 200 may be a Finite Impulse Response (FIR) filter as it may be used in digital signal processing. The digital filter 200 includes a first stage 1 operating at a low frequency clock and a second stage 2 operating at a high frequency clock, wherein a ratio $\mu_I$ of the low frequency clock and the high frequency clock may be a fractional number. Referring to FIG. 1, the ratio $\mu_I$ may have a value of, for instance, 3/16 or 16/3.

The first stage 1 includes a first input 3 configured to receive input data to be filtered by the digital filter 200. For example, the input data may be represented by a bit sequence clocked with the low frequency clock. A second input 4 of the digital filter 200 receives a signal representing the ratio $\mu_I$ of the low frequency clock and the high frequency clock, and a third input 5 receives a signal representing a time offset $\mu_O$ between a clock pulse of the high frequency clock, which occurs between a first clock pulse and a second clock pulse of the low frequency clock, and the first clock pulse of the low frequency clock. Referring to the example of FIG. 1, the third input 5 may receive a value of $\mu_{O,1}$ (i.e. 2/3 in units of the high frequency clock) in connection with the first time interval, a value of $\mu_{O,2}$ in connection with the second time interval and a value of one in connection with the third time interval.

The second stage 2 includes a first output 6 configured to output data filtered by the digital filter 200. For example, the output data may be represented by a bit sequence clocked with the high frequency clock. Since the input data received at the first input 3 indicates a lower frequency clock than data provided by the first output 6, the digital filter 200 may be referred to as an interpolation filter. More detailed embodiments of interpolation filters corresponding to the digital filter 200 will be described later.

Figure 3:
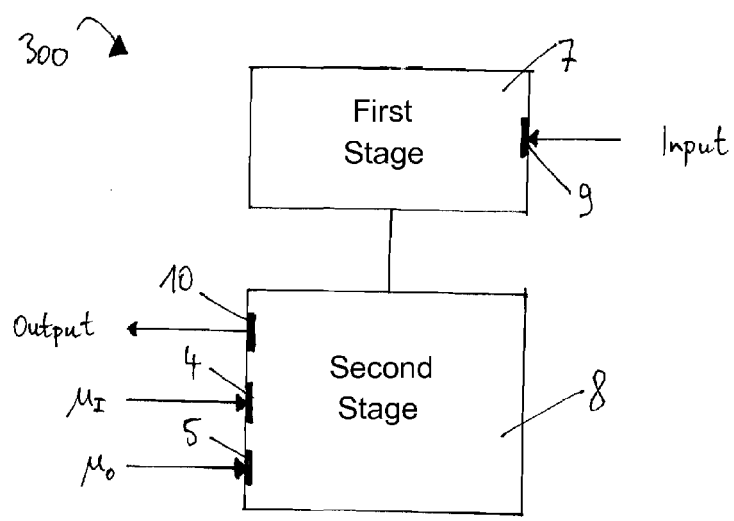
FIG. 3 schematically illustrates a digital filter 300 as an exemplary embodiment.

FIG. 3 schematically illustrates a digital filter 300 as an exemplary embodiment. The digital filter 300 includes a first stage 7 operating at a high frequency clock and a second stage 8 operating at a low frequency clock, wherein a ratio $\mu_I$ of the low frequency clock and the high frequency clock may correspond to a fractional number (cf. FIG. 1).

The first stage 7 includes a first input 9 configured to receive input data to be filtered by the digital filter 300. For example, the input data may be represented by a binary bit sequence clocked with the high frequency clock. A second input 4 of the second stage 8 receives a signal representing the ratio $\mu_I$ of the low frequency clock and the high frequency clock, and a third input 5 receives a signal representing a time offset $\mu_O$ between a clock pulse of the high frequency clock and a clock pulse of the low frequency clock. Referring back to the example of FIG. 1, the third input 5 may receive a value of $\mu_{O,1}$ in connection with the first time interval, a value of $\mu_{O,2}$ in connection with the second time interval and a value of one in connection with the third time interval.

The second stage 8 further includes a first output 10 configured to output data filtered by the digital filter 300. For example, the output data may be represented by a binary bit sequence clocked with the low frequency clock. For the case of the digital filter 300, the input data received at the first input 9 has a higher frequency clock than the filtered output data provided by the first output 10. The digital filter 300 may thus be referred to as a decimation filter. More detailed embodiments of decimation filters corresponding to the digital filter 300 will be described later.

Figure 4:
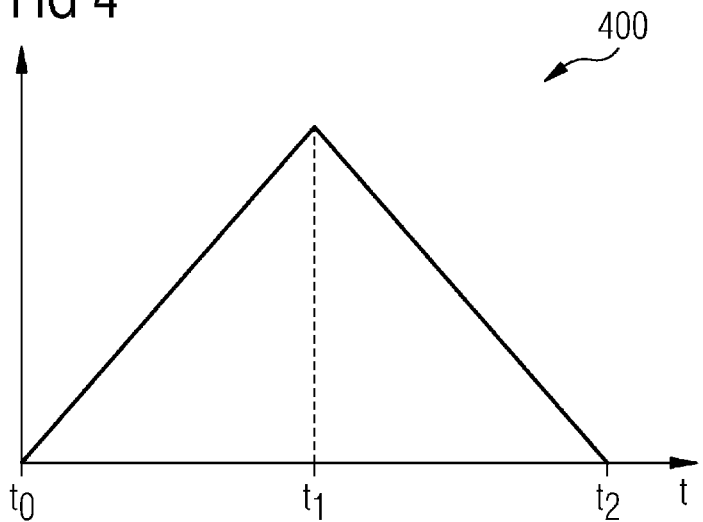
FIG. 4 shows an illustrative pulse response 400.

FIG. 4 illustrates a pulse response 400 of a linear digital filter, i.e. a digital filter of order one. A pulse response describes the reaction of a digital filter on an input signal in form of a Dirac pulse. That is, the output signal of a digital filter may be determined by a convolution of the pulse response with the corresponding input signal. In FIG. 4, the amplitude of the pulse response (cf. vertical axis) is plotted against time (cf. horizontal axis).

The pulse response 400 may be divided into a first time interval between the times $t_0$ and $t_1$ and a second time interval between the times $t_1$ and $t_2$ with both time intervals having identical lengths. Each time interval may be divided in an arbitrary number of equidistant support points, wherein the length of the sub-time intervals in between these support points may depend on a frequency of a clock. For example, the first time interval between the times $t_0$ and $t_1$ may correspond to the first time interval between the times $t_0$ and $t_{1,1}$ of FIG. 1 and the second time interval between the times $t_1$ and $t_2$ may correspond to the second time interval between the times $t_{1,1}$ and $t_{1,2}$ of FIG. 1.

Each time interval of the pulse response 400 may be described by a polynomial P of order one, i.e. a straight line determined by two coefficients of a linear equation. Since the pulse response 400 may be divided into two straight lines (cf. first and second time interval in FIG. 4), the pulse response of the corresponding digital filter is determined by four filter coefficients $k_{11}, k_{12}, k_{21}, k_{22}$. These filter coefficients may be written in form of a (2×2)-matrix such as $$M = \begin{pmatrix} k_{12} & k_{11} \\ k_{22} & k_{21} \end{pmatrix}. \tag{1}$$

Figure 5:
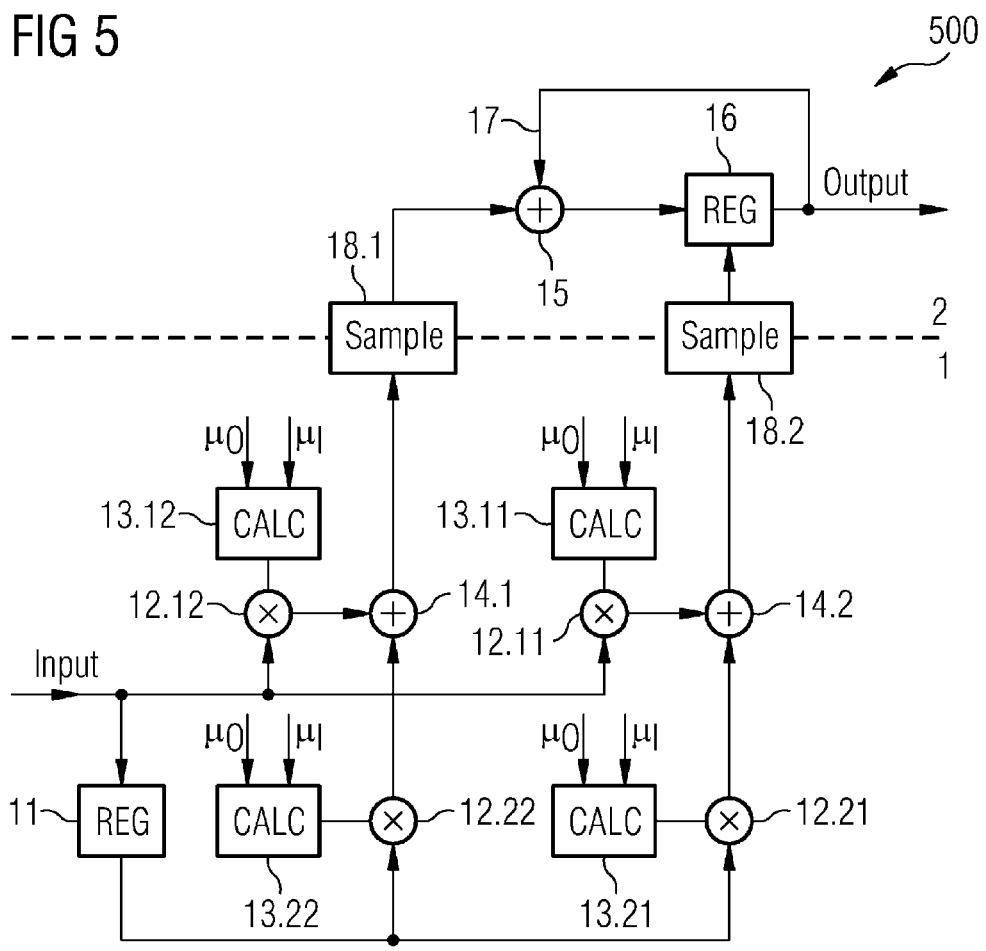
FIG. 5 schematically illustrates a digital filter 500 as an exemplary embodiment.

FIG. 5 schematically illustrates a digital interpolation filter 500 as an exemplary embodiment. The digital filter 500 represents a more detailed implementation of the digital filter 200 and may be described by the pulse response illustrated in FIG. 4.

The digital filter 500 includes a first stage 1 operating at a low frequency clock and a second stage 2 operating at a high frequency clock, wherein a ratio $\mu_I$ of the frequency clocks may be fractional number. The first stage 1 includes a first register 11, multipliers 12.11, 12.12, 12.21, 12.22, calculation units 13.11, 13.12, 13.21, 13.22 and adders 14.1, 14.2. The components of the first stage 1 are connected with each other via signal paths as illustrated in FIG. 5.

The digital filter 500 receives input data to be filtered (cf. "Input"), the ratio $\mu_I$ of the low frequency clock and the high frequency clock and the time offset $\mu_O$. These input values may be received by an arbitrary number of inputs of the digital filter 500. Each of the calculation units 13.11 to 13.22 is configured to receive the values $\mu_I$ and $\mu_O$ and thus the input of the digital filter 500 receiving the values of $\mu_I$ and $\mu_O$ is connected to the calculations units 13.11 to 13.22.

The second stage 2 includes a closed-loop time-delay element having an adder 15 and a second register 16 arranged in series, wherein an output of the second register 16 is connected to an input of the adder 15 via a feedback loop 17. The second stage 2 may be referred to as integrator stage and further includes an output (cf. "Output") to provide data filtered by the digital filter 500. The first stage 1 and the second stage 2 are connected via sampling circuits 18.1 and 18.2.

The digital filter 500 further includes a counter configured to count down an arbitrary number. For example, the counter may count down a number of clock pulses of the high frequency clock occurring between succeeding clock pulses of the low frequency clock (cf. FIG. 1). The counter may be connected to the sampling circuit 18.2 in such a way that the sampling circuit 18.2 may set the second register 16 to a predetermined value when the counter has counted down the first number. The predetermined value may correspond to a value stored in the sampling circuit 18.2.

In the following, an operating mode of the digital filter 500 will be explained. The digital filter 500 receives input data of a low frequency clock and processes the input data in various signal paths as illustrated in FIG. 5. Each of the calculation units 13.11 to 13.22 calculates a different one of the filter coefficients $k_{11}$, $k_{12}$, $k_{21}$, $k_{22}$ of the digital filter 500 which are then multiplied with the input data by means of the multipliers 12.11 to 12.22. Note that the matrix M of equation (1) including the filter coefficients is arranged similar to the calculation units 13.11 to 13.22 of FIG. 5. That is, the filter coefficient $k_{11}$ is calculated by the calculation unit 13.11, the filter coefficient $k_{12}$ is calculated by the calculation unit 13.12, etc. Of course, the calculation units 13.11 to 13.22 may be combined in a single calculation unit. Note that input data passing the first register 11 is delayed in comparison to input data not passing the first register 11.

The filter coefficients $k_{11}$, $k_{12}$, $k_{21}$, $k_{22}$ may depend on at least one of the ratio $\mu_I$ of the low frequency clock and the high frequency clock and the time offset $\mu_O$. The calculation of the filter coefficients via the calculation units 13.11 to 13.22 may be based on any functional relationship. The operating mode of the digital filter 500 may thus be determined by the specific configuration of the calculation units 13.11 to 13.22.

The input data processed by the components (multipliers, adders, etc.) of the first stage 1 is forwarded to the sampling circuits 18.1 and 18.2 via two signal paths. The sampling circuit 18.1 is clocked with the high frequency clock and due to the summation performed by the adder 15, the value of the second register 16 is incremented at each clock pulse of the high frequency clock (cf. low peaks in FIG. 1). The sampling circuit 18.2 sets the value of the second register 16 to a predetermined value at each clock pulse of the high frequency clock following a clock pulse of the low frequency clock (cf. low peaks following the high peaks in FIG. 1). The times of these clock pulses are determined by the values of the time offset $\mu_O$ and the number of clock pulses of the high frequency clock occurring between clock pulses of the low frequency clock. In particular, at or otherwise responsive to the clock pulses of the high frequency clock, the sampling circuit 18.2 writes processed input data received by the adder 14.2 into the second register 16.

For example, referring to the second time interval of FIG. 1, the counter of the digital filter 500 counts down from a value of five (cf. the five low peaks occurring between the times $t_{1,1}$ and $t_{1,2}$). Reaching the value of zero and taking into account the value of the time offset $\mu_{O,2}$, the sampling circuit 18.2 writes a predetermined value into the second register 16 at the time of, or otherwise responsive to, the clock pulse of the high frequency clock following the clock pulse of the low frequency clock at the time $t_{1,2}$.

The matrix M including the filter coefficients $k_{11}$, $k_{12}$, $k_{21}$, $k_{22}$ of the digital filter 500 may be derived to read $$M = \begin{pmatrix} 1 & \mu_O \\ -1 & \frac{1}{\mu_I} - \mu_O \end{pmatrix}. \qquad (2)$$

FIG. 6 schematically illustrates a digital interpolation filter 600 as an exemplary embodiment. The digital filter 600 represents a more detailed implementation of the digital filter 200. Similar to the digital filter 500, the digital filter 600 may be described by the pulse response as illustrated in FIG. 4.

The digital filter 600 includes a first stage 1 operating at a low frequency clock and a second stage 2 operating at a high frequency clock, wherein a ratio $\mu_I$ of the frequency clocks may be a fractional number. The first stage 1 includes a first register 11, multipliers 12.1, 12.2 and adders 14.1, 14.2. The components of the first stage 1 are connected with each other via signal paths as illustrated in FIG. 6.

The first stage 1 includes an arbitrary number of inputs to receive data to be filtered (cf. "Input"), the ratio $\mu_I$ and the time offset $\mu_O$. It is understood that the input of the digital filter 600 is connected to the multipliers 12.1 and 12.2 in such a way that the multipliers 12.1 and 12.2 receive the parameters $\mu_I$ and $\mu_O$.

The second stage 2 of the digital filter 600 corresponds to the second stage 2 of the digital filter 500. The same holds true for the coupling between the stages 1 and 2 via sampling circuits 18.1 and 18.2. Moreover, the digital filter 600 includes a counter as it has already been described in connection with FIG. 5.

In the following, differences between the first stages 1 of the digital filters 500 and 600 are considered. Both filters 500 and 600 are of order one and are thus determined by four filter coefficients $k_{11}$, $k_{12}$, $k_{21}$, $k_{22}$. While the first stage 1 of the digital filter 500 includes a multiplier for each filter coefficient, the first stage 1 of the digital filter 600 merely includes two multipliers. This reduction of multipliers may lead to a reduction of computational steps and thus a reduction of power consumption.

In contrast to the digital filter 500, the digital filter 600 does not include calculation units for calculating filter coefficients. In FIG. 6, the input data is directly multiplied by the ratio $\mu_I$ and the time offset $\mu_O$ via the multipliers 12.1 and 12.2. Additional calculation steps as they are performed by the calculation units 13.11 to 13.22 of FIG. 5 are omitted. Generally, the multipliers 12.1 and 12.2 of the digital filter 600 may receive and apply arbitrary values depending on the ratio $\mu_I$ and the time offset $\mu_O$ according to any desired functional relationship.

From FIGS. 5 and 6 it becomes apparent that the first stages 1 of the digital filters 500 and 600 differ concerning their arrangements of multipliers and adders. As can be seen from FIG. 5, the first register 11 of the digital filter 500 is coupled to the multipliers 12.11 to 12.22, while the first register 11 of the digital filter 600 is coupled to the adders 14.1 and 14.2. Note that the first and second stages of both filters 500 and 600 include the same number of registers.

The matrix M including the filter coefficients of the digital filter 600 may be derived to read $$M = \begin{pmatrix} \mu_I & \mu_O \cdot \mu_I \\ -\mu_I & 1 - \mu_O \cdot \mu_I \end{pmatrix}. \qquad (3)$$

A comparison of equations (2) and (3) shows that the matrices M of the digital filters 500 and 600 differ by a factor of $\mu_I$. This difference results in different filter gains.

FIG. 7 shows a pulse response 700 of a quadratic digital filter, i.e. a digital filter of order two. Similar to FIG. 4, the amplitude of the pulse response is plotted against time. The pulse response 700 may be divided into a first time interval between the times $t_0$ and $t_1$, a second time interval between the times $t_1$ and $t_2$ and a third time interval between the times $t_2$ and $t_3$.

The three time intervals of FIG. 7 may be identified with, for example, the three time intervals of the timing diagram 100. Similar to FIG. 4, the time intervals may be divided in an arbitrary number of equidistant support points or sub-time intervals in between these support points.

Each time interval of the pulse response 700 may be described by a polynomial P of order two, i.e. a quadratic function determined by three coefficients. Since the pulse response 700 may thus be represented by three quadratic functions with the pulse response of the corresponding digital filter being determined by nine filter coefficients $k_{11}$, $k_{12}$, $k_{13}$, $k_{21}$, $k_{22}$, $k_{23}$, $k_{31}$, $k_{32}$, $k_{33}$. These filter coefficients may be written in form of a (3×3)-matrix such as $$M = \begin{pmatrix} k_{13} & k_{12} & k_{11} \\ k_{23} & k_{22} & k_{21} \\ k_{33} & k_{32} & k_{31} \end{pmatrix}. \quad (4)$$

Figure 8:
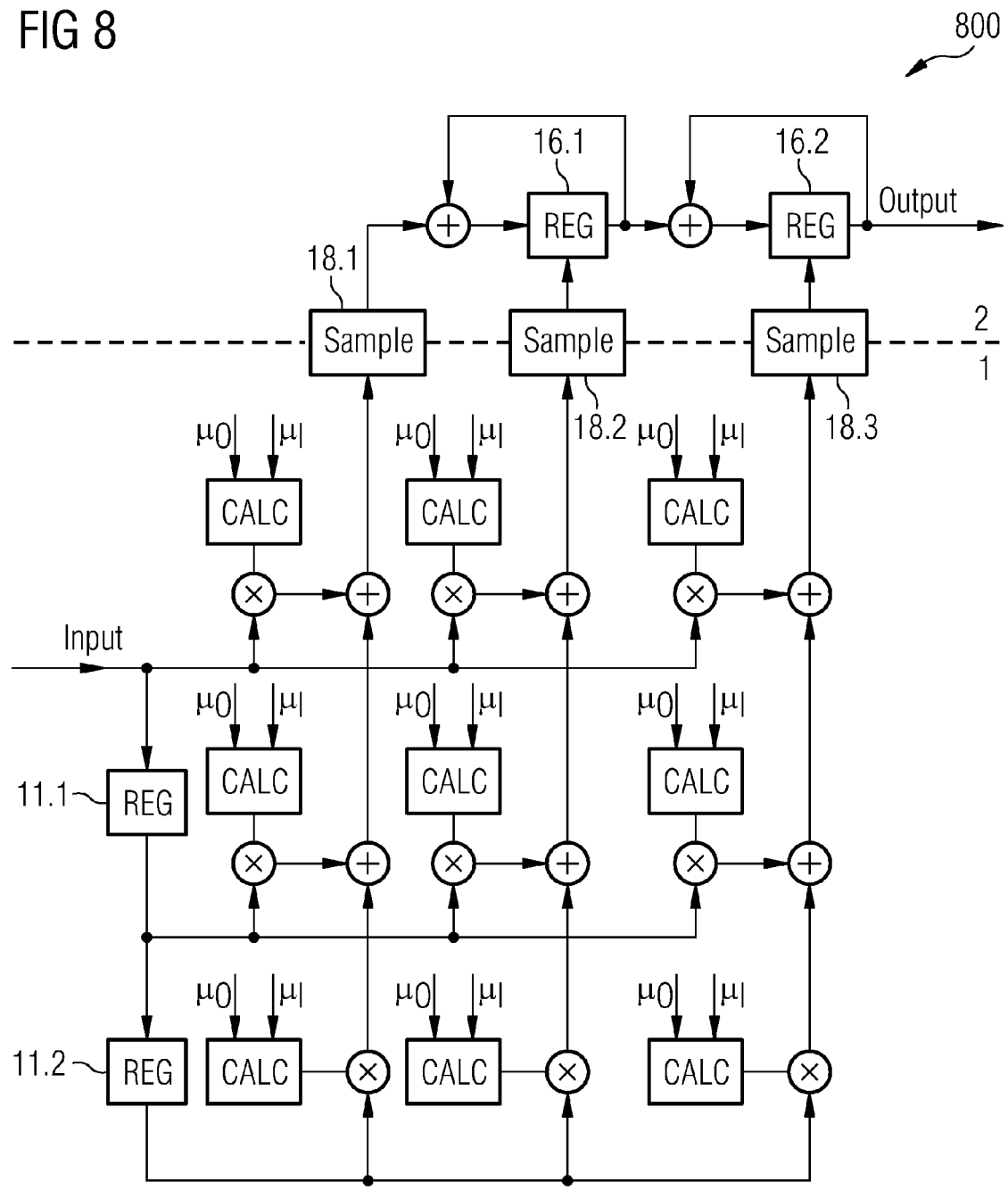
FIG. 8 schematically illustrates a digital filter 800 as an exemplary embodiment.

FIG. 8 schematically illustrates a digital interpolation filter 800 as an exemplary embodiment. For the sake of simplicity, not all components of the digital filter 800 are labeled by reference signs. The digital filter 800 represents a more detailed implementation of the digital filter 200 and may be described by the pulse response as illustrated in FIG. 7.

The digital filter 800 shows a design similar to the digital filter 500. Since the pulse response of the digital filter 800 depends on nine filter coefficients, the number of multipliers, adders and calculation units of the first stage 1 is extended to a quantity of nine. Moreover, the first stage 1 and the second stage 2 each includes two registers 11.1, 11.2, 16.1 and 16.2, respectively. Since there are three signal paths coupling the first stage 1 and the second stage 2, the digital filter 800 includes three sampling circuits 18.1, 18.2 and 18.3.

The operating mode of the digital filter 800 corresponds to the operating mode of the digital filter 500 and becomes apparent from the description of FIG. 5. FIGS. 5 and 8 further show that similar filters of order n>2 may be designed in a straightforward way by simply adding columns and rows of multipliers, adders, etc.

One example of a digital filter 800 of order two is a digital filter performing a quadratic Lagrange interpolation. The associated matrix M of filter coefficients may be derived to read $$M = \begin{pmatrix} 2 & 1+2\mu_O & -\frac{1}{4\mu_I^2}+\mu_O^2 \\ -4 & -2+\frac{2}{\mu_I}-4\mu_O & \frac{3}{2\mu_I^2}+\frac{2\mu_O}{\mu_I}-2\mu_O^2 \\ 2 & 1-\frac{2}{\mu_I}+2\mu_O & \frac{3}{4\mu_I^2}-\frac{2\mu_O}{\mu_I}+\mu_O^2 \end{pmatrix}. \quad (5)$$

Here, the filter gain depends on the interpolation factor. By dividing the matrix M by a factor of $$\frac{2}{\mu_I^2},$$

the filter gain may be scaled to a constant value of one.

An example for a digital filter 800 of order two is a digital filter performing a quadratic B-Spline interpolation. The associated matrix M of filter coefficients may be derived to read $$M = \begin{pmatrix} 2 & 1+2\mu_O & \mu_O^2 \\ -4 & -2+\frac{2}{\mu_I}-4\mu_O & \frac{1}{\mu_I^2}+\frac{2\mu_O}{\mu_I}-2\mu_O^2 \\ 2 & 1-\frac{2}{\mu_I}+2\mu_O & \frac{1}{\mu_I^2}-\frac{2\mu_O}{\mu_I}+\mu_O^2 \end{pmatrix}. \quad (6)$$

Again, the filter gain depends on the interpolation factor. Dividing the matrix M by a factor of $$\frac{2}{\mu_I^2}$$

leads to a filter gain of a constant value of one.

Figure 9:
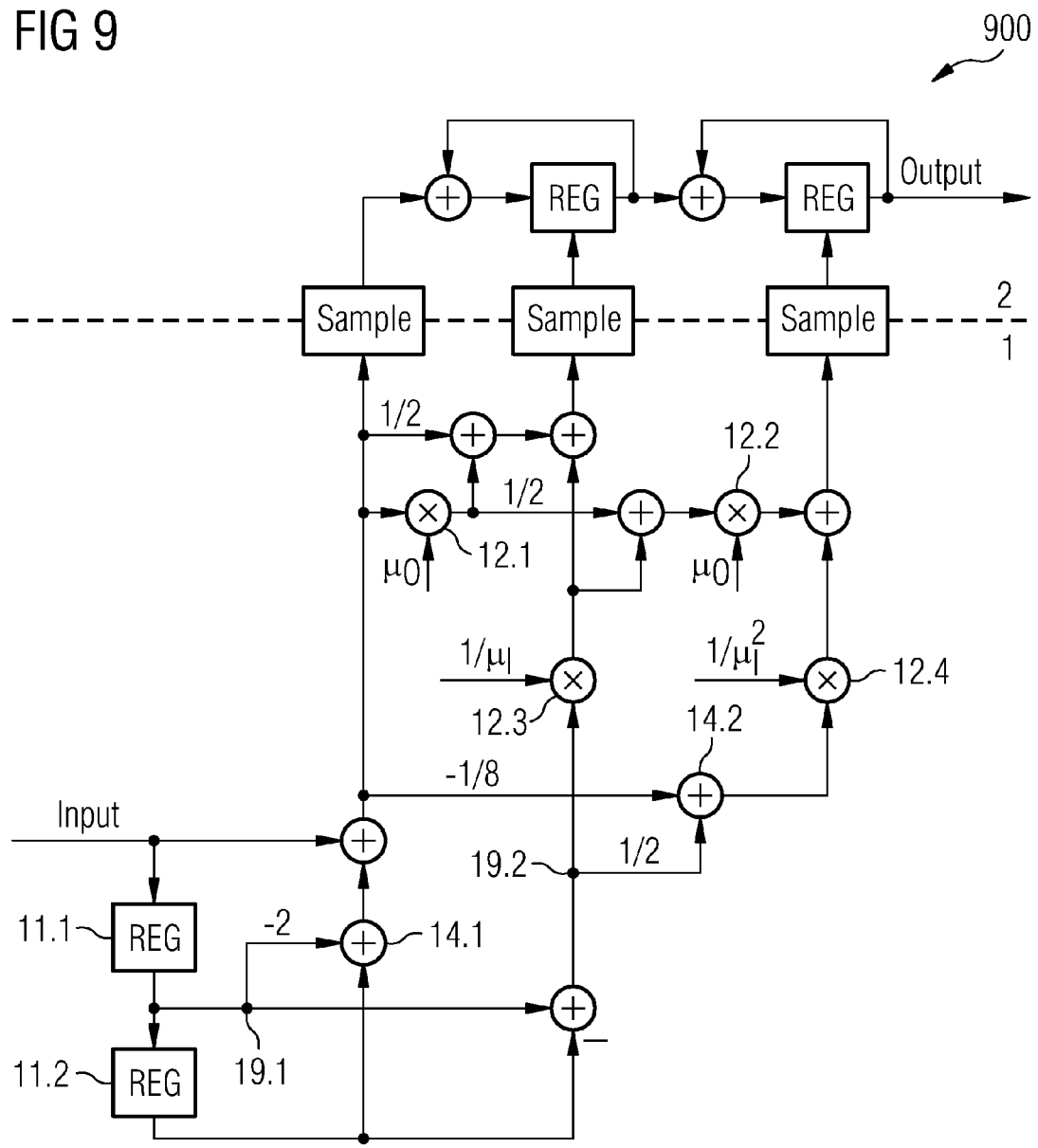
FIG. 9 schematically illustrates a digital filter 900 as an exemplary embodiment.

FIG. 9 schematically illustrates a digital interpolation filter 900 as an exemplary embodiment. The digital filter 900 represents a more detailed implementation of the digital filter 200 and performs a quadratic Lagrange interpolation. For the sake of simplicity, not all components of the digital filter 900 are labeled by reference signs.

The first stage 1 of the digital filter 900 includes two first registers 11.1, 11.2, multiple adders and multiple multipliers. The multipliers 12.1 and 12.2 multiply the input data with a value of $\mu_O$, the multiplier 12.3 multiplies the input data with a value of $1/\mu_I$ and the multiplier 12.4 multiplies the input data with a value of $1/\mu_I^2$. The digital filter 900 may directly receive the required values $1/\mu_I$ and $1/\mu_I^2$ or may alternatively include additional calculation units to calculate these values from an input value of $\mu_I$.

The digital filter 900 includes further units performing multiplication operations of input data. In FIG. 9, these multiplication operations are denoted by numerical values such as a value of "−2" shown over the signal path between the adder 14.1 and the node 19.1 or a value of "1/2" shown over the signal path between the adder 14.2 and the node 19.2. For example, the value of "−2" denotes a multiplication by a value of minus two, while the value "1/2" denotes a multiplication by a value of one half which may be performed by shifting bits representing the input data.

The digital filters 800 and 900 mainly differ concerning the same features as the digital filters 500 and 600 which have been described above. For example, the digital filter 900 includes fewer adders and fewer multipliers than the digital filter 800 and thus may exhibit a reduced power consumption.

The matrix M including the filter coefficients of the digital filter 900 may be derived to read $$M = \begin{pmatrix} 1 & \frac{1}{2} + \mu_O & -\frac{1}{8\mu_I^2} + \frac{\mu_O^2}{2} \\ -2 & -1 + \frac{1}{\mu_I} - 2\mu_O & \frac{3}{4\mu_I^2} + \frac{\mu_O}{\mu_I} - \mu_O^2 \\ 1 & \frac{1}{2} - \frac{1}{\mu_I} + \mu_O & \frac{3}{8\mu_I^2} - \frac{\mu_O}{\mu_I} + \frac{\mu_O^2}{2} \end{pmatrix} \quad (7)$$

A comparison of equations (5) and (7) shows that the matrices M of the digital filters 800 and 900 differ by a factor of two. Note that, except for a factor of two, both digital filters 800 and 900 show identical pulse responses. For the case of equation (7) the filter gain depends on the interpolation factor.

Figure 10:
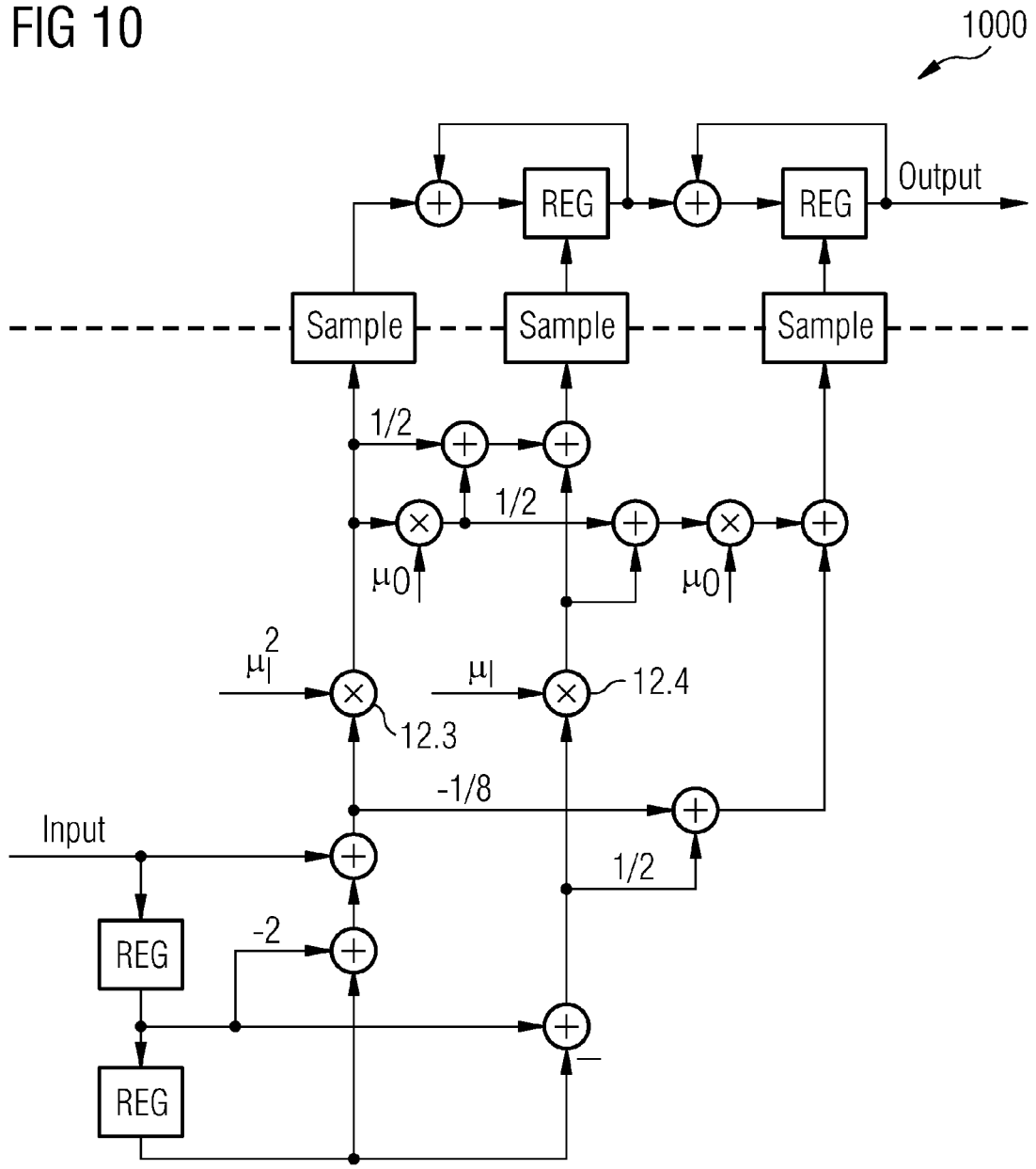
FIG. 10 schematically illustrates a digital filter 1000 as an exemplary embodiment.

FIG. 10 schematically illustrates a digital interpolation filter 1000 as an exemplary embodiment. For the sake of simplicity, not all components are labeled by reference signs. Similar to the digital filter 900, the digital filter 1000 performs a quadratic Lagrange interpolation. The digital filters 900 and 1000 differ in the arrangement of the multipliers 12.3 and 12.4, as well as the input values of these multipliers. While the multipliers 12.3 and 12.4 of the digital filter 900 receive values of $1/\mu_I$ and $1/\mu_I^2$, the multipliers 12.3 and 12.4 of the digital filter 1000 receive input values of $\mu_I$ and $\mu_I^2$.

The matrix M including the filter coefficients of the digital filter 1000 may be derived to read $$M = \begin{pmatrix} \mu_I^2 & \frac{\mu_I^2}{2} + \mu_O\mu_I^2 & -\frac{1}{8} + \frac{\mu_O^2\mu_I^2}{2} \\ -2\mu_I^2 & -\mu_I^2 + \mu_I - 2\mu_O\mu_I^2 & \frac{3}{4} + \mu_O\mu_I - \mu_O^2\mu_I^2 \\ \mu_I^2 & \frac{\mu_I^2}{2} - \mu_I + \mu_O\mu_I^2 & \frac{3}{8} - \mu_O\mu_I + \frac{\mu_O^2\mu_I^2}{2} \end{pmatrix} \quad (8)$$

A comparison of equations (7) and (8) shows that the matrices M of the digital filters 900 and 1000 differ by a factor of $\mu_I^2$. The filter gain of the digital filter 1000 is one.

Figure 11:
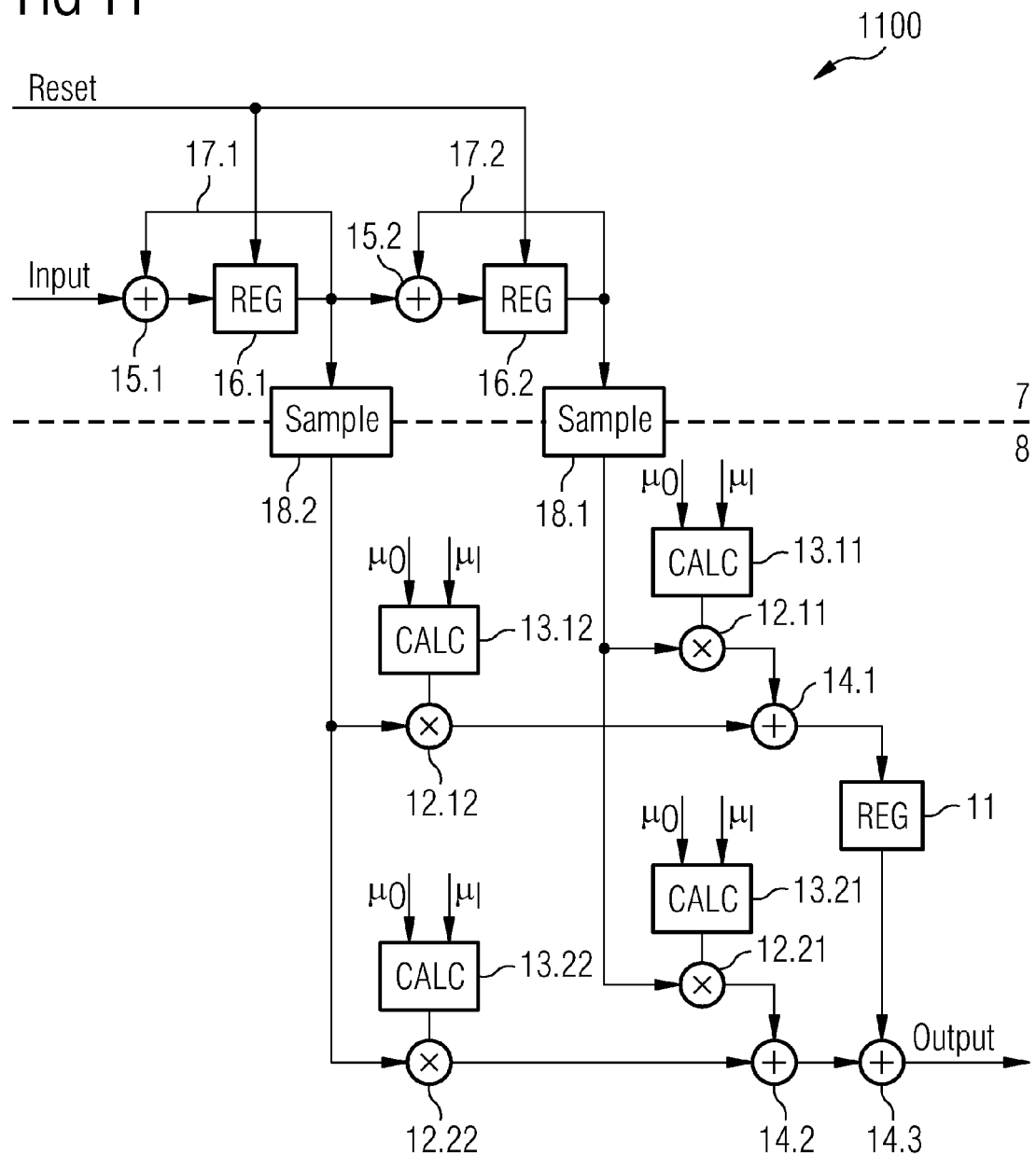
FIG. 11 schematically illustrates a digital filter 1100 as an exemplary embodiment.

FIG. 11 schematically illustrates a digital decimation filter 1100 as an exemplary embodiment. The digital filter 1100 represents a more detailed implementation of the digital filter 300 and may be described by the pulse response illustrated in FIG. 4. The digital decimation filter 1100 may be seen as a counterpart of the digital interpolation filter 500.

The digital filter 1100 includes a first stage 7 operating at a high frequency clock and a second stage 8 operating at a low frequency clock, wherein a ratio pi of the frequency clocks may be a fractional number. The first stage 7 includes two closed-loop time-delay elements having an adder 15.1 (15.2) and a first register 16.1 (16.2), respectively. An output of each first register 16.1 (16.2) is connected to an input of the adder 15.1 (15.2) via a feedback loop 17.1 (17.2). The first stage 7 may be referred to as integrator stage and includes a first input (cf. "Input") to receive data to be filtered. Note that the first stage 7 of the digital filter 1110 includes an additional closed-loop time-delay element compared to the second stage 2 of the digital filter 500.

The second stage 8 includes a first register 11, multipliers 12.11, 12.12, 12.21, 12.22, calculation units 13.11, 13.12, 13.21, 13.22 and adders 14.1, 14.2, 14.3. The components of the second stage 8 are connected with each other via signal paths as illustrated in FIG. 11. Note that the digital filter 1100 may be extended to a filter of order n>1 in a straightforward way by adding further columns and rows of multipliers, adders, etc.

The second stage 8 includes an arbitrary number of inputs to receive the ratio $\mu_I$ and the time offset $\mu_O$. Each calculation unit 13.11 to 13.22 is configured to receive the values $\mu_I$ and $\mu_O$ and thus the input of the digital filter 1100 is connected to the calculations units 13.11 to 13.22. The second stage 8 further includes an output (cf. "Output") to provide filtered output data. The first stage 7 and the second stage 8 are connected by sampling circuits 18.1 and 18.2.

Similar to the digital filter 500, the digital filter 1100 includes a counter (not illustrated) to count down arbitrary numbers. For example, the counter may count down a number of clock pulses of the high frequency clock occurring between succeeding clock pulses of the low frequency clock (cf. FIG. 1). The counter is connected to the registers 16.1 and 16.2 (cf. "Reset") in such a way that these registers may be set to a predetermined value (preferably a value of zero) when the counter has count down.

The operating mode of the digital filter 1100 becomes apparent from the description of the operating mode of the digital filter 500. Both filters 500 and 1100 process data to be filtered in a similar way, but in opposite directions. For the case of the digital filter 500, input data is interpolated by converting it from a low frequency clock to a high frequency clock, while the digital filter 1100 decimates input data to be filtered by converting it from a high frequency clock to a low frequency clock. Note that the registers 16.1 and 16.2 are preferably reset to a predetermined value at a clock pulse of the high frequency clock following a clock pulse of the low frequency clock. Before the registers 16.1 and 16.2 are reset, the sampling circuits 18.1 and 18.2 read out the values stored in the registers 16.1 and 16.2 and forward these values to the second stage 8.

The filter coefficients of the digital filter 1100 may be expressed according to equation (1). Similar to FIG. 5, the calculation units 13.11 to 13.22 of FIG. 11 are arranged according to the filter coefficients of the matrix M in equation (1). That is, the filter coefficient $k_{11}$ is calculated by the calculation unit 13.11, the filter coefficient $k_{12}$ is calculated by the calculation unit 13.12, etc. A comparison of FIGS. 5 and 11 shows that the designs of the digital filters 500 and 1100 are mirror-inverted to each other with respect to a vertical axis. For example, the register 11 in FIG. 5 is arranged on the very left, while the register 11 in FIG. 11 is arranged on the very right. Moreover, the calculation unit 13.12 in FIG. 5 corresponds to the calculation unit 13.11 in FIG. 11, the calculation unit 13.22 in FIG. 5 corresponds to the calculation unit 13.21 in FIG. 11, etc. The mirror-inversion corresponds to an exchange of columns in the matrix M of filter coefficients.

If a decimator structure would emerge from the interpolator structure of FIG. 5 by purely inverting the direction of the data to be filtered, this data would pass the register 11 of the resulting decimator in a direction (bottom-up) which is opposite to the direction of the data passing the register 11 of the integrator 500 (top down). However, in FIG. 11 the data to be filtered passes the register 11 similar to FIG. 5 (top down). This results in an exchange of the rows in the matrix M of filter coefficients. In summary, the matrix M of filter coefficients for the digital filter 1100 may thus be obtained from the matrix M of filter coefficients for the digital filter 500 (cf. equation (2)) by exchanging columns and rows, as follows:

$$M = \begin{pmatrix} \frac{1}{\mu_I} - \mu_O & -1 \\ \mu_O & 1 \end{pmatrix}. \quad (9)$$

Figure 12:
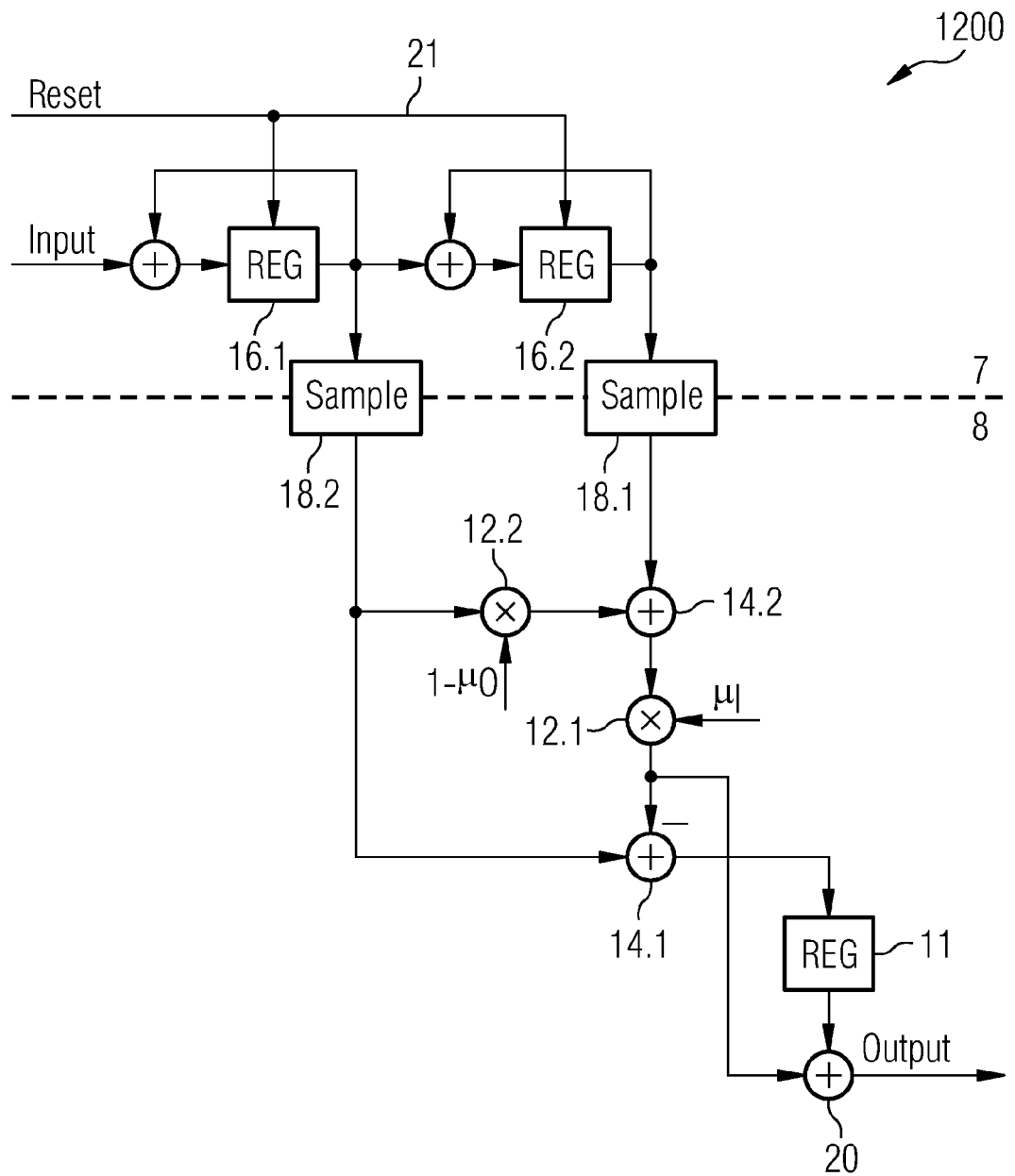
FIG. 12 schematically illustrates a digital filter 1200 as an exemplary embodiment.

FIG. 12 schematically illustrates a digital decimation filter 1200 as an exemplary embodiment, wherein not all components are labeled by reference signs. The digital filter 1200 represents a more detailed implementation of the digital filter 300 and may be described by a pulse response illustrated in FIG. 4.

The digital filter 1200 includes a first stage 7 operating at a high frequency clock and a second stage 8 operating at a low frequency clock, wherein a ratio $\mu_f$ of the frequency clocks may be a fractional number. The first stage 7 of the digital filter 1200 corresponds to the first stage 7 of the digital filter 1100. The same holds true for the coupling between the stages 7 and 8 via sampling circuits 18.1 and 18.2. The second stage 8 includes a register 11, multipliers 12.1, 12.2, adders 14.1, 14.2 and an adding unit 20. The components of the second stage 8 are connected with each other via signal paths as it is illustrated in FIG. 12.

Again, the digital filter 1200 includes a counter to count down an arbitrary number as it has already been described in connection with previous figures. The registers 16.1 and 16.2 of the first stage 7 may be set to an arbitrary value via a signal line 21.

The first stage 7 receives data to be filtered (cf. "Input"), while the second stage 8 provides filtered output data (cf. "Output"). The operating mode of the digital filter 1200 becomes apparent from the description of previous embodiments. The matrix M including the filter coefficients of the digital filter 1200 may be derived to read $$M = \begin{pmatrix} 1 - \mu_O \cdot \mu_I & -\mu_I \\ \mu_O \cdot \mu_I & \mu_I \end{pmatrix}. \quad (10)$$

A comparison of equations (9) and (10) shows that the matrices M of the digital filters 1100 and 1200 differ by a factor of $\mu_f$. This difference results in different filter gains.

From the timing diagram 100 of FIG. 1 it becomes apparent that the number of clock pulses of the high frequency clock occurring between clock pulses of the low frequency clock may vary. Here, the timing diagram 100 showed possible values of five and six. Pulse responses of digital filters as illustrated in FIGS. 4 and 7 may thus differ in their respective lengths. The decimation filters 1100 and 1200 are configured to filter input data, wherein the length of the employed pulse response may vary over time. It may, however, be desirable to employ pulse responses of a fixed length. A digital filter 1300 supporting a filtering based on pulse responses of fixed length will be described in the following.

Figure 13:
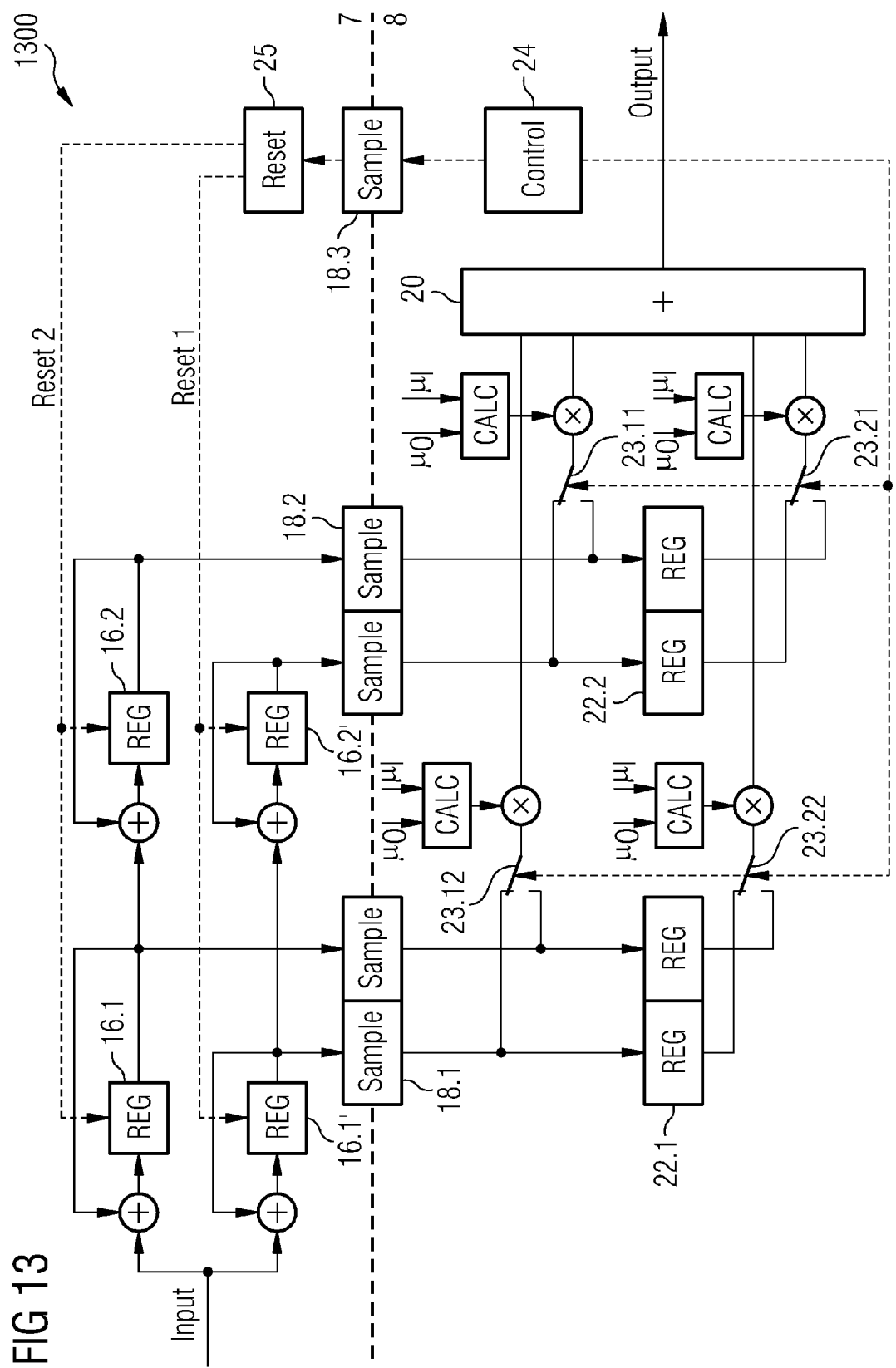
FIG. 13 schematically illustrates a digital filter 1300 as an exemplary embodiment.

FIG. 13 schematically illustrates a digital decimation filter 1300 as an exemplary embodiment. For the sake of simplicity, not all components of the filter 1300 are labeled by reference signs. The digital filter 1300 may be described by a pulse response of a fixed length as illustrated in FIG. 4.

The digital filter 1300 includes a first stage 7 operating at a high frequency clock and a second stage 8 operating at a low frequency clock, wherein a ratio $\mu_f$ of the frequency clocks may be fractional number. The first stage 7 includes an input (cf. "Input") to receive data to be filtered. The input of the first stage 7 is connected to a first (upper) and a second (lower) signal path, wherein each of these signal paths corresponds to the signal path in the first stage 7 of the digital filter 1200.

The first stage 7 and the second stage 8 are connected via pairs of sampling circuits 18.1, 18.2 and a sampling circuit 18.3. Each of the pairs includes a sampling circuit connected with the output of a register of the first signal path as well as a sampling circuit connected with a register of the second signal path. Detailed connections become apparent from FIG. 13.

Similar to the digital filter 1100, the second stage 8 of the digital filter 1300 includes multiple multipliers, calculation units and adders, the arrangement of which can be seen from FIG. 13. In addition, the second stage 8 includes an addition unit 20, two pairs of registers 22.1 and 22.2 and switches 23.11 to 23.22 to switch between signal lines as illustrated in FIG. 13. Note that the digital filter 1300 may be extended to a digital filter of order n>1 in a straightforward way by adding additional columns and rows including multiplication units, adders, multipliers, etc.

Again, the digital filter 1300 includes a counter to count down an arbitrary number. The counter may be included, for example, in a control unit 24 to control the time when the switches 23.11 to 23.22 switch between signal lines as illustrated in FIG. 13. Further, the control unit 24 controls the time when the registers 16.1, 16.2, 16.1' and 16.2' of the first stage 7 are set to a predetermined value. The control unit 24 is connected to a reset unit 25 which generates the reset of the first registers 16.1 to 16.2'.

The operating mode of the digital filter 1300 partly corresponds to the operating mode of the digital filter 1100. For example, the calculation units 13.11 to 13.22 operate in a similar way. A difference between the operating modes of the digital filters 1100 and 1300 results from additional components included in the digital filter 1300, in particular from the second signal path in the first stage 7 and the additional switches 23.11 to 23.22 in the second stage 8.

Figure 14:
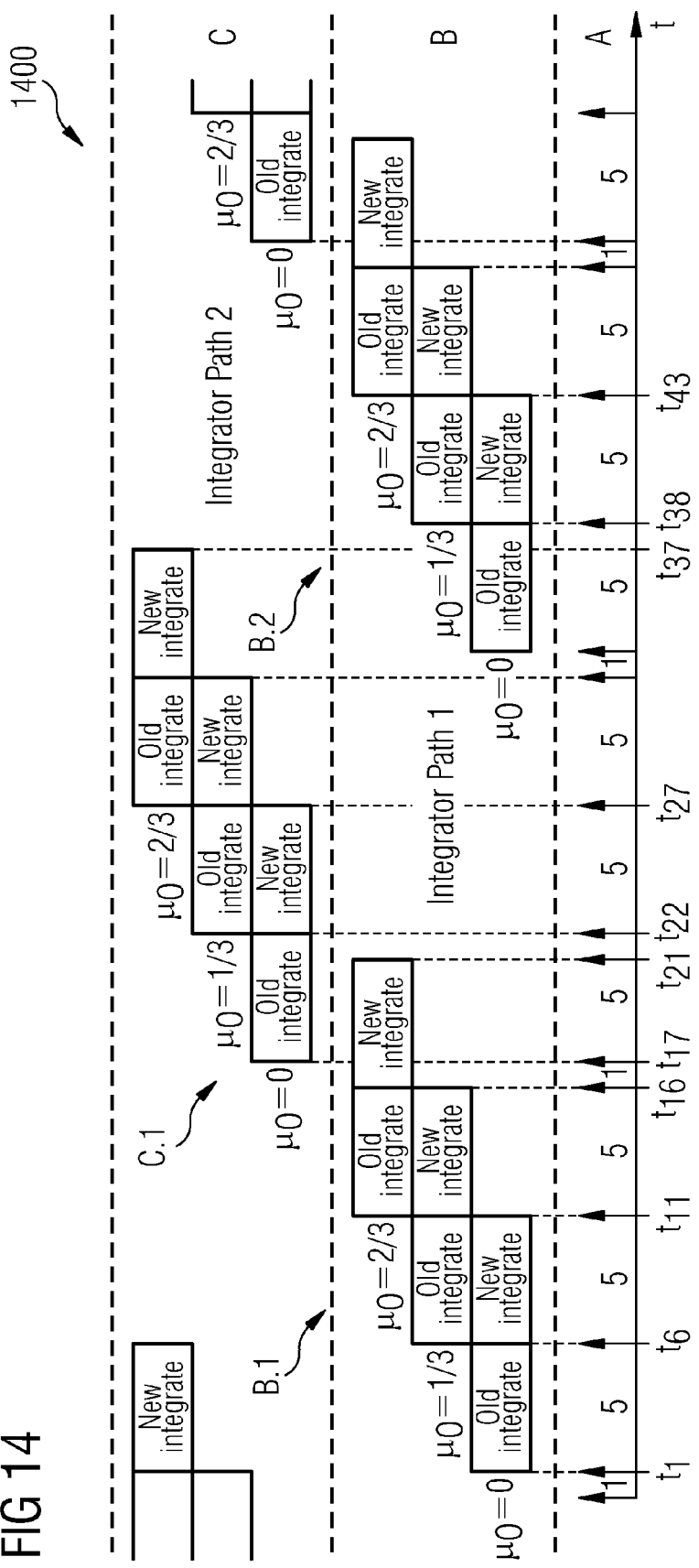
FIG. 14 schematically illustrates a diagram 1400 illustrating an operating mode of the digital filter 1300.

FIG. 14 schematically illustrates a diagram 1400 illustrating an operating mode of the digital filter 1300. Here, the ratio of the low frequency clock and the high frequency clock has a value 16/3. The diagram 1400 includes a first part A illustrating an example of a timing diagram, a second part B relating to an example of the operation of the upper signal path of the first stage 7 and a third part C relating to an example of the operation of the lower signal path of the first stage 7. In the following, the upper and lower signal path of the first stage 7 may also be denoted as first and second integrator paths, respectively.

Part A of the diagram 1400 shows arrows representing clock pulses of the high frequency clock. The arrows indicate time intervals lying in between, wherein numbers located between the arrows indicate the lengths of the time intervals in units of the cycle duration of the high frequency clock. For example, the time intervals labeled by "5" have a length of five cycle durations of the high frequency clock. Note that the time intervals indicated by "5" include further clock pulses of the high frequency clock which are not explicitly illustrated for the sake of simplicity.

Part B of the diagram illustrates an operating mode of the first integrator path of the digital filter 1300. Here, a first operating period is illustrated by a first block B.1. A first integration performed by the first integrator path and associated with an offset value $\mu_O$ of zero is indicated by two rectangles (cf. "Old integration" and "New integration"). The first integration starts at a time $t_1$ and ends at a time $t_{11}$ and thus has a length of ten cycle durations of the high frequency clock.

The integration indicated by said two rectangles corresponds to an integration over one pulse response. Note that FIG. 14 relates to a linear filter having a pulse response similar to FIG. 4. The first rectangle (cf. "Old integration") indicates an integration over the ascending part of the pulse response 400, while the second rectangle (cf. "New integration") indicates an integration over the descending part of the pulse response 400. The pulse response thus has a length of ten cycle durations of the high frequency clock. Of course, during an operation of the first integrator path, the switches 23.11 to 23.22 of the digital filter 1300 are in a position connecting the first integrator path to the second stage 8.

Still referring to the first block B.1, a second integration associated with an offset value $\mu_O$ of 1/3 is similarly indicated by two rectangles. The second integration starts at a time $t_6$ and ends at the time $t_{11}$. In block B.1, the new integration for an offset value $\mu_O$ of zero overlaps with the old integration for an offset value $\mu_O$ of 1/3. This overlap does not indicate a twofold integration of the first integrator path, but is meant to indicate that these two integrations are identical. The first block B.1 further shows a third integration which has a length of five clock periods of the high frequency clock and starts at the time $t_{11}$. The registers 16.1 and 16.2 of the first integrator path are reset to a predetermined value (preferably a value of zero) at start times of the old integrations, i.e. at the times $t_1$, $t_6$, $t_{11}$ and $t_{16}$.

Part C of the diagram illustrates an operating mode of the second integrator path of the digital filter 1300. A block C.1 illustrates an operating period including three integrations, each integration being associated with an offset value $\mu_O$. Concerning its structure, the block C.1 corresponds to the block B.1. The times indicating the start and end points of the three integrations become apparent from FIG. 14.

Note that the start of the old integration associated with an offset value $\mu_O$ of zero in block C.1 (cf. time $t_{17}$) is delayed or shifted by one clock duration of the high frequency clock with respect to the start of the new integration associated with an offset value $\mu_O$ of 2/3 in block B.1 (cf. time $t_{16}$). At a time $t_{21}$, the integration associated with an offset value $\mu_O$ of 2/3 in block B.1 is finished, while, at a time $t_{27}$, the integration associated with an offset value $\mu_O$ of zero in block C.1 is finished. The switches 23.11 to 23.22 of the digital filter 1300 thus preferably switch their position at a time lying between a time $t_{22}$ and the time $t_{27}$, thereby connecting the second integrator path of the first stage 7 to the second stage 8. Similar to the block B.1, the registers 16.1' and 16.2' of the second integrator path are reset to a predetermined value (preferably a value of zero) at the times indicating a start of an old integration.

Part B includes a second block B.2 illustrating a further operating period of the first integrator path. Again, the start of the old integration associated with an offset value $\mu_O$ of zero in block B.2 is delayed or shifted by one clock duration of the high frequency clock with respect to the start of the new integration associated with an offset value $\mu_O$ of 2/3 in block C.1. Moreover, the registers 16.1 and 16.2 of the first integrator path are reset to a predetermined value (preferably a value of zero) at the times at the start indicating a start of an old integration. At a time $t_{37}$, the integration associated with an offset value $\mu_O$ of 2/3 in block C.1 is finished, while, at a time $t_{43}$, the integration associated with an offset value $\mu_O$ of zero in block B.2 is finished. The switches 23.11 to 23.22 of the digital filter 1300 thus preferably switch their position at a time lying between a time $t_{38}$ and the time $t_{43}$, thereby connecting the first integrator path of the first stage 7 to the second stage 8.

The digital filters described above use the value of the time offset $\mu_O$ and the number of clock pulses of the high frequency occurring between clock pulses of the low frequency clock. The following description is dedicated to a digital device providing these values.

Figure 15:
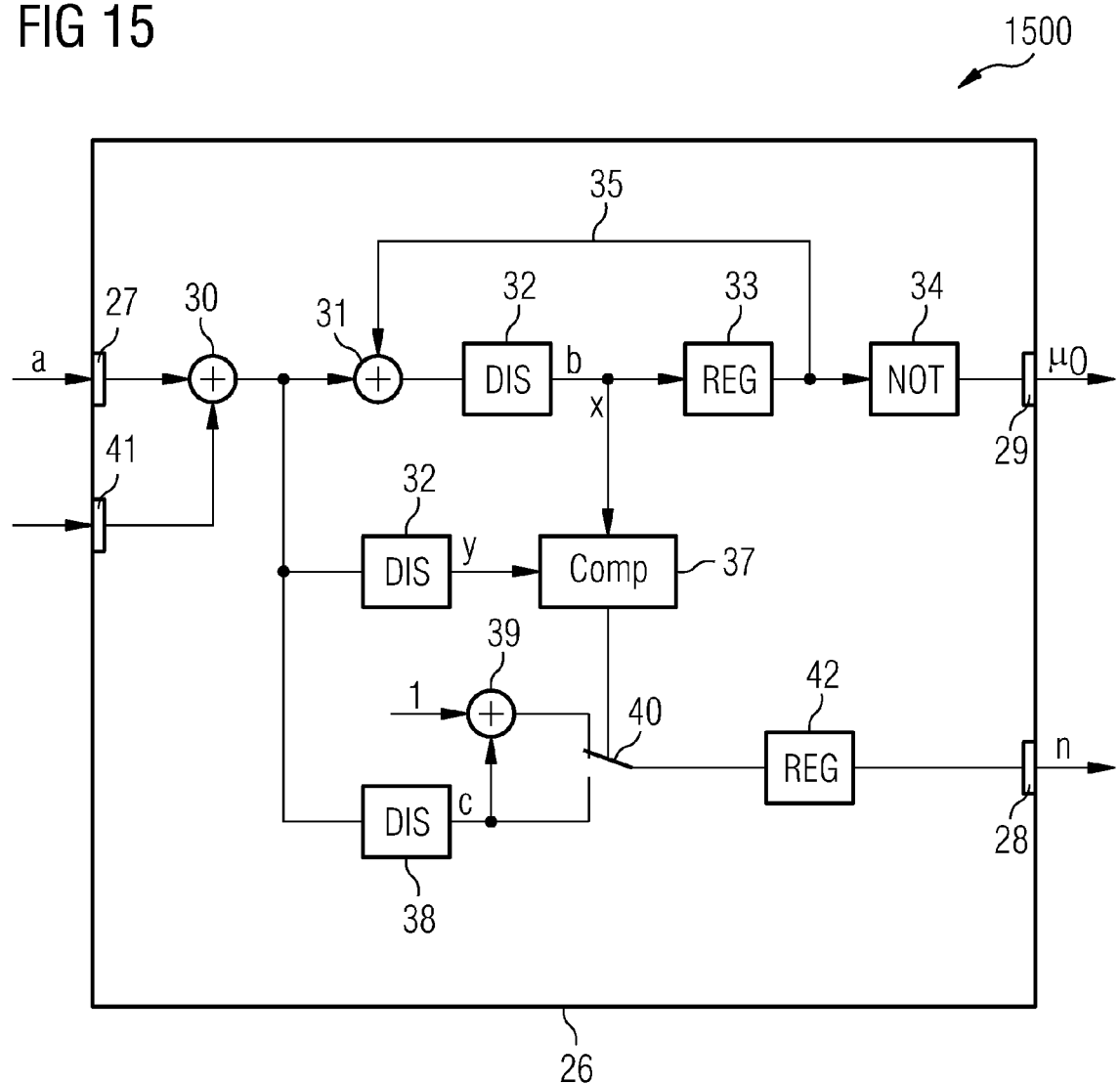
FIG. 15 schematically illustrates a digital device 1500 as an exemplary embodiment.

FIG. 15 schematically illustrates a digital device 1500 which may also be denoted by the reference sign 26. The device 26 includes a first input 27, a first output 28 and a second output 29, wherein the first input 27 is connected to a third adder 30. The third adder 30 is connected to a first (upper) signal path, a second (middle) signal path and a third (lower) signal path.

The first signal path includes a first adder 31, a first discarding unit 32, a first register 33 and a NOT gate 34 arranged in series. The first register 33 and the first adder 31 are connected by a feedback loop 35. The output of the NOT gate 34 is connected to the second output 29. The second signal path includes a second discarding unit 36 and a comparison unit 37 arranged in series. The comparison unit 37 is connected to the first signal path at a contact arranged between the first discarding unit 32 and the first register 33. The third signal path includes a third discarding unit 38, a second adder 39 and a switch 40. The switch 40 includes two switch positions selectively connecting the first output 28 to the third discarding unit 38 or the second adder 39. Moreover, the switch 40 is connected to the comparison unit 37 and a second register 42. The device 26 further includes a second input 41 connected to the third adder 30.

In the following, an operating mode of the device 1500 will be explained using the timing diagram 100 of FIG. 1. The first time interval between the times $t_0$ and $t_{1,1}$ corresponds to a first operation cycle of the device 1500. A ratio of a low frequency clock and a high frequency clock is input into the first input 27 of the device 1500. A data word representing this ratio may, for example, be represented by 29 (e.g., unsigned) bits, wherein the 6 most significant bits (MSB) represent an integer portion of the ratio and the remaining 23 least significant bits (LSB) represent a decimal portion of the ratio. For the case of the timing diagram 100, the ratio might have a value of 16/3. Accordingly, the six MSB represent an integer portion of five and the 23 LSB represent a decimal portion of 1/3.

The ratio of the low frequency clock and the high frequency clock may be corrected by a correction value provided by the second input 41. The correction value is added to the ratio via the third adder 30. Such a correction may be helpful for the case of unstable frequency clocks that may occur for the case of unstable oscillators generating the frequency clocks. In the following example, the correction value is assumed to be zero.

The fractional value of 16/3 is forwarded to the first adder 31. Since the first register 33 is set to a value of zero for the first operation cycle of the device 1500, the feedback loop 35 provides a value of zero to the first adder 31. The first discarding unit 32 thus receives a value of 16/3 and discards, e.g., deletes, the six MSB representing the integer portion of 16/3, i.e. a value of five. The remaining 23 LSB representing a value of 1/3 are forwarded to the first register 33. The NOT gate 34 receives the value of 1/3 and subtracts this value from a value of one leading to a value of 2/3 forwarded to the second output 29. The described subtraction corresponds to inverting the 23 LSB and may thus also be referred to as an inversion.

Still referring to the first operation cycle of the device 1500, the second discarding unit 36 in the second signal path discards the six MSB and forwards the remaining 23 LSB representing a value of 1/3 to the comparison unit 37. In the lower signal path, the third discarding unit 38 discards the 23 LSB (i.e. a decimal portion of 1/3) and outputs the remaining six MSB representing a value of five. For the first operation cycle, the switch 40 is set to a default first switch position connecting the first output 28 to the output of the third discarding unit 38.

The comparison unit 37 compares a value x received from the first discarding unit 32 and a value y received from the second discarding unit 36. If the value x is smaller than the value y, then in response the comparison unit 37 controls the switch 40 in such a way that the switch 40 changes from the first switch position to a second switch position connecting the first output 28 to the second adder 39. If the switch 40 is in the second switch position, then in response the second adder 39 adds a value of one to the value output by the third discarding unit 38. In the first operation cycle, the values x and y both equal 1/3 and thus the switch 40 does not change from the first to the second switch position. Since no value of one is added by the second adder 39 during the first operation cycle, the first output 28 outputs a value of five.

In accordance with the timing diagram 100, the second output 29 outputs a value of 2/3 corresponding to the time offset $\mu_{O,1}$ and the first output 28 outputs a value of five corresponding to the number of clock pulses of the high frequency clock occurring during the first time interval between the times $t_0$ and $t_{1,1}$.

In the following, the second and third operation cycle of the device 1500 will be explained. Here, the second operation cycle corresponds to the second time interval between the times $t_{1,1}$ and $t_{1,2}$ and the third operation cycle corresponds to the third time interval between the times $t_{1,2}$ and $t_{1,3}$. For a better understanding, the following Table 1 shows illustrative values at different locations in the device 1500 during its different operation cycles.

TABLE 1

| Cycle No. | a | b | c | $\mu_O$ | n |
|---|---|---|---|---|---|
| 1 | 16/3 | 1/3 | 5 | 2/3 | 5 |
| 2 | 16/3 | 2/3 | 5 | 1/3 | 5 |
| 3 | 16/3 | 0 | 5 | 1 | 6 |

In Table 1, the parameter a denotes the value input to the first input 27, the parameter b denotes the value output by the first discarding unit 32, the parameter c denotes the value output by the third discarding unit 38, the value $\mu_O$ denotes the time offset output by the second output 29 and the parameter n denotes the number of high frequency clock pulses occurring during the regarded time interval output by the first output 28.

For the first operation cycle, the table values have already been derived: a=16/3, b=1/3, c=5, $\mu_O$=2/3 and n=5. Referring now to the second operation cycle, the ratio of the low frequency clock and the high frequency clock remains the same, i.e. a=16/3. The first adder 31 adds a value of 16/3 and a value of 1/3 (provided by the feedback loop 35) leading to a value of 17/3, the integer portion of which is discarded by the first discarding unit 32. Therefore, b equals a value of 2/3. Note that the addition performed by the first adder 31 may lead to an additional MSB for proper representation of the integer portion of the ratio. An inversion performed by the NOT gate 34 leads to a time offset value $\mu_O$ of 1/3 for the second operation cycle output by the second output 29.

Due to discarding the decimal portion of the input ratio 16/3, the third discarding unit 38 outputs a value c of five. Since x equals 2/3 and y equals 1/3, the switch 40 does not change to the second switch position connecting the first output 28 to the second adder 39. Accordingly, the second adder 39 does not add a value of one and the first output 28 outputs a value of five.

Referring now to the third operation cycle, the ratio input at the first input 27 still remains the same, i.e. a=16/3. The first adder 31 adds a value of 16/3 and a value of 2/3 (provided by the feedback loop 34) leading to a value of 18/3, whose integer portion of six is discarded by the first discarding unit 32. Therefore, b equals zero and the NOT gate 34 forwards a time offset $\mu_O$ of one to the second output 29.

Due to discarding the decimal portion of the input ratio 16/3, the third discarding unit 38 again outputs a value c of five. Since x now equals zero and y equals 1/3, the switch 40 changes from the first switch position to the second switch position connecting the first output 28 to the second adder 39. Accordingly, the second adder 39 adds a value of one to the value c and the first output 28 outputs a value of six.

As already mentioned in the description of FIG. 1, later time intervals may be obtained by simply repeating the first three time intervals. For example, a fourth time interval would then correspond to the first time interval, a fifth time interval would correspond to the second time interval, etc. In this connection, it is to be noted that the first register 33 may be reset to a value of zero after the third time interval has passed.

What is claimed is:

1. A digital filter, comprising:
a first stage configured to operate at a first clock, the first stage having a first input, a second input and a third input; and
a second stage configured to operate at a second clock, the second stage having a first output, wherein:
a frequency of the second clock is higher than a frequency of the first clock,
a ratio of a frequency of the first clock and a frequency of the second clock is a fractional number,
the first input is configured to receive input data to be filtered,
the second input is configured to receive an indication of the ratio of the first clock and the second clock,
the third input is configured to receive an indication of a time offset between (1) a clock pulse of the second clock, which occurs between a first clock pulse and a second clock pulse of the first clock, and (2) the first clock pulse of the first clock, and the first output is configured to provide filtered output data.

2. The digital filter of claim 1, wherein the first stage comprises a calculation unit configured to calculate a filter coefficient of the digital filter such that the filter coefficient depends on at least one of (1) the ratio of the first clock and the second clock and (2) the time offset.

3. The digital filter of claim 1, wherein the digital filter is of order n, a pulse response of the digital filter is determined by $(n+1)^2$ filter coefficients of the digital filter and the first stage comprises $(n+1)^2$ multipliers, each of the multipliers configured to multiply the input data with a respective one of the filter coefficients of the digital filter.

4. The digital filter of claim 1, wherein the digital filter is of order n, a pulse response of the digital filter is determined by $(n+1)^2$ filter coefficients of the digital filter and the first stage comprises less than $(n+1)^2$ multipliers.

5. The digital filter of claim 4, wherein at least one of the multipliers is configured to multiply the input data with a value depending on the ratio of the first clock and the second clock.

6. The digital filter of claim 4, wherein at least one of the multipliers is configured to multiply the input data with a value depending on the time offset.

7. The digital filter of claim 1, wherein the second stage is an integrator stage comprising a closed-loop time-delay element clocked with the second clock.

8. The digital filter of claim 7, further comprising:
a counter configured to count down a first number of clock pulses of the second clock occurring between a first clock pulse and a second clock pulse of the first clock.

9. The digital filter of claim 8, wherein the closed-loop time-delay element is configured to be set to a predetermined value when the counter has count down the first number.

10. The digital filter of claim 1, wherein the first stage comprises a plurality of registers and each of the registers is connected to an adder.

11. The digital filter of claim 1, wherein the digital filter is of order n and each of the first stage and the second stage comprises at most a number of n registers.

12. A method, comprising:
a first stage of a digital filter receiving input data to be filtered, the first stage of a digital filter operating at a first clock;
a second stage of the digital filter outputting filtered output data, the second stage of the digital filter operating on a second clock, wherein a ratio of a frequency of the first clock and a frequency of the second clock is a fractional number, and a frequency of the second clock is higher than a frequency of the first clock;
the first stage receiving an indication of a ratio of the first clock and the second clock; and
the first stage receiving an indication of a time offset between (1) a clock pulse of the second clock, which occurs between a first clock pulse and a second clock pulse of the first clock, and (2) the first clock pulse of the first clock.

13. The method of claim 12, further comprising:
determining a filter coefficient of the digital filter such that the filter coefficient depends on at least one of the ratio of the low frequency clock and the high frequency clock and the time offset.

14. A digital filter, comprising:
a first stage operating at a first clock having a first input; and
a second stage operating at a second clock having a second input, a third input and a first output, wherein:
a frequency of the first clock is higher than a frequency of the second clock,
a ratio of a frequency of the second clock and a frequency of the first clock is a fractional number,
the first input is configured to receive input data to be filtered,
the second input is configured to receive an indication of the ratio of the second clock and the second clock,
the third input is configured to receive an indication of a time offset between (1) a clock pulse of the first clock, which occurs between a first clock pulse and a second clock pulse of the second clock, and (2) the first clock pulse of the second clock, and
the first output is configured to provide filtered output data.

15. The digital filter of claim 14, wherein the second stage comprises a calculation unit configured to calculate a filter coefficient of the digital filter such that the filter coefficient depends on at least one of the ratio of the second clock and the first clock and the time offset.

16. The digital filter of claim 14, wherein the digital filter is of order n, a pulse response of the digital filter is determined by $(n+1)^2$ filter coefficients of the digital filter and the second stage comprises $(n+1)^2$ multipliers, each of the multipliers configured to multiply the input data with a respective one of the filter coefficients of the digital filter.

17. The digital filter of claim 14, wherein the digital filter is of order n, a pulse response of the digital filter is determined by $(n+1)^2$ filter coefficients of the digital filter and the second stage comprises less than $(n+1)^2$ multipliers.

18. The digital filter of claim 17, wherein at least one of the multipliers is configured to multiply the input data with a value depending on the ratio of the second clock and the first clock.

19. The digital filter of claim 17, wherein at least one of the multipliers is configured to multiply the input data with a value depending on the time offset.

20. The digital filter of claim 14, wherein the first stage is an integrator stage comprising a closed-loop time-delay element clocked with the first clock.

21. The digital filter of claim 14, further comprising:
a counter configured to count down a first number of clock pulses of the first clock occurring between a first clock pulse and a second clock pulse of the second clock.

22. The digital filter of claim 21, wherein the closed-loop time-delay element is configured to be set to a predetermined value when the counter has count down the first number.

23. The digital filter of claim 14, wherein the first stage is an integrator stage comprising a first closed-loop time-delay element and a second closed-loop time-delay element arranged in parallel signal paths.

24. The digital filter of claim 23, wherein the second stage comprises a switch configured to switch between coupling the first closed-loop time-delay element to a calculation unit and coupling the second closed-loop time-delay element to the calculation unit.

25. A method, comprising:
a first stage of a digital filter receiving input data to be filtered, the digital filter operating at a first clock;
a second stage of the digital filter outputting filtered output data, the second stage of the digital filter operating on a second clock, wherein a ratio of the second clock and the first clock is a fractional number, and a frequency of the first clock is higher than a frequency of the second clock;
the second stage receiving an indication of a ratio of the second clock and the first clock; and
the second stage receiving an indication of a time offset between (1) a clock pulse of the first clock, which occurs between a first clock pulse and a second clock pulse of the second clock, and (2) the first clock pulse of the second clock.

* * * * *